United States Patent
Ding et al.

(10) Patent No.: US 8,232,115 B2
(45) Date of Patent: Jul. 31, 2012

(54) TEST STRUCTURE FOR DETERMINATION OF TSV DEPTH

(75) Inventors: Hanyi Ding, Essex Junction, VT (US); Kai D. Feng, Hopewell Junction, NY (US); Ping-Chuan Wang, Hopewell Junction, NY (US); Zhijian Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/566,726

(22) Filed: Sep. 25, 2009

(65) Prior Publication Data

US 2011/0073858 A1    Mar. 31, 2011

(51) Int. Cl.
*H01L 21/66* (2006.01)

(52) U.S. Cl. .......... 438/17; 438/667; 438/668; 438/637; 438/638; 438/14; 438/18; 257/48; 257/E21.531

(58) Field of Classification Search .............. 438/17, 438/14, 667, 668, 637, 638, 18; 257/48, 257/E21.531
See application file for complete search history.

(56) References Cited

U.S. PATENT DOCUMENTS

| | | | |
|---|---|---|---|
| 4,481,061 A | 11/1984 | Ross | |
| 6,129,807 A | 10/2000 | Grimbergen et al. | |
| 6,391,669 B1 | 5/2002 | Fasano et al. | |
| 6,396,076 B1 | 5/2002 | Tom | |
| 6,503,765 B1 | 1/2003 | Chao et al. | |
| 6,709,881 B2 | 3/2004 | Hasegawa et al. | |
| 6,720,229 B2 | 4/2004 | Norstrom et al. | |
| 6,977,186 B2 | 12/2005 | Hasegawa et al. | |
| 7,491,555 B2 | 2/2009 | Lehr et al. | |
| 7,514,276 B1 | 4/2009 | Yearous et al. | |
| 7,528,492 B2 | 5/2009 | Chen | |
| 2002/0057176 A1 | 5/2002 | Norstrom et al. | |
| 2006/0127652 A1 | 6/2006 | Kanaya et al. | |
| 2006/0154388 A1 | 7/2006 | Lewington et al. | |
| 2007/0048883 A1* | 3/2007 | Lehr et al. | 438/14 |
| 2007/0054422 A1* | 3/2007 | Lerner | 438/14 |
| 2008/0079121 A1* | 4/2008 | Han | 257/621 |
| 2009/0085217 A1 | 4/2009 | Knickerbocker et al. | |

OTHER PUBLICATIONS

Pending U.S. Appl. No. 12/371,724, filed Feb. 16, 2009.
Hallas et al. Test Structure for Semiconductor Chips. IPCOMM000086251D. Aug. 1, 1976. International Business Machines Corporation.

* cited by examiner

*Primary Examiner* — Junghwa M Im
(74) *Attorney, Agent, or Firm* — Cantor Colburn LLP; Ian MacKinnon (57) ABSTRACT

A test structure for a through-silicon-via (TSV) in a semiconductor chip includes a first contact, the first contact being electrically connected to a first TSV; and a second contact, wherein the first contact, second contact, and the first TSV form a first channel, and a depth of the first TSV is determined based on a resistance of the first channel. A method of determining a depth of a through-silicon-via (TSV) in a semiconductor chip includes etching a first TSV into the semiconductor chip; forming a first channel, the first channel comprising the first TSV, a first contact electrically connected to the first TSV, and a second contact; connecting a current source to the second contact; determining a resistance across the first channel; and determining a depth of the first TSV based on the resistance of the first channel.

11 Claims, 11 Drawing Sheets

ETCH FUNCTIONAL AND TEST TSVS INTO SEMICONDUCTOR CHIP
1201

MASK FUNCTIONAL TSVS AND FILL TEST TSVS WITH LINER AND METAL FILLING
1202

FORM TEST STRUCTURE AROUND TEST TSVS
1203

DETERMINE TSV DEPTH USING TEST STRUCTURE
1204

IF TSV DEPTH IS NOT DEEP ENOUGH, ETCH FUNCTIONAL TSVS TO CORRECT DEPTH
1205

PERFORM FILLING OF FUNCTIONAL TSVS, GRINDING, DEPOSITION OF BSM
1206

FIG. 12

TEST STRUCTURE FOR DETERMINATION OF TSV DEPTH

BACKGROUND

This disclosure relates generally to the field of semiconductor chip fabrication and testing.

A through-silicon-via, or TSV, provides electrical continuity between the top and bottom surfaces of a semiconductor chip. A TSV is fabricated by deep etching into the silicon wafer, or substrate, that comprises the semiconductor chip, and filling the resulting hole with a liner and a metal filling. The silicon substrate is then ground, or thinned, from the backside until the metal filling is exposed, and backside metal (BSM) is disposed on the thinned backside surface for electrical contact. If the silicon is not etched deeply enough, the TSV may be defective. However, the TSV is not electrically functional before silicon thinning and BSM deposition are completed, therefore, conventional inline electrical testing cannot be used to determine whether the TSV is defective until these steps are completed. Because TSV yield problems may only be detected after the additional process steps are completed, the throughput, efficiency and cost of the semiconductor fabrication process may be negatively impacted.

SUMMARY

An exemplary embodiment of a test structure for a through-silicon-via (TSV) in a semiconductor chip includes a first contact, the first contact being electrically connected to a first TSV; and a second contact, wherein the first contact, second contact, and the first TSV form a first channel, and a depth of the first TSV is determined based on a resistance of the first channel.

An exemplary embodiment of a method of determining a depth of a through-silicon-via (TSV) in a semiconductor chip includes etching a first TSV into the semiconductor chip; forming a first channel, the first channel comprising the first TSV, a first contact electrically connected to the first TSV, and a second contact; connecting a current source to the second contact; determining a resistance across the first channel; and determining a depth of the first TSV based on the resistance of the first channel.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of structures and methods for determination of TSV depth are provided, with exemplary embodiments being discussed below in detail. A test structure allows determination of TSV depth to be performed before grinding and BSM deposition are performed. In some embodiments, an under-etched TSV may be reworked. The test structure may be implemented in the kerf region of the semiconductor chip.

Figure 1:
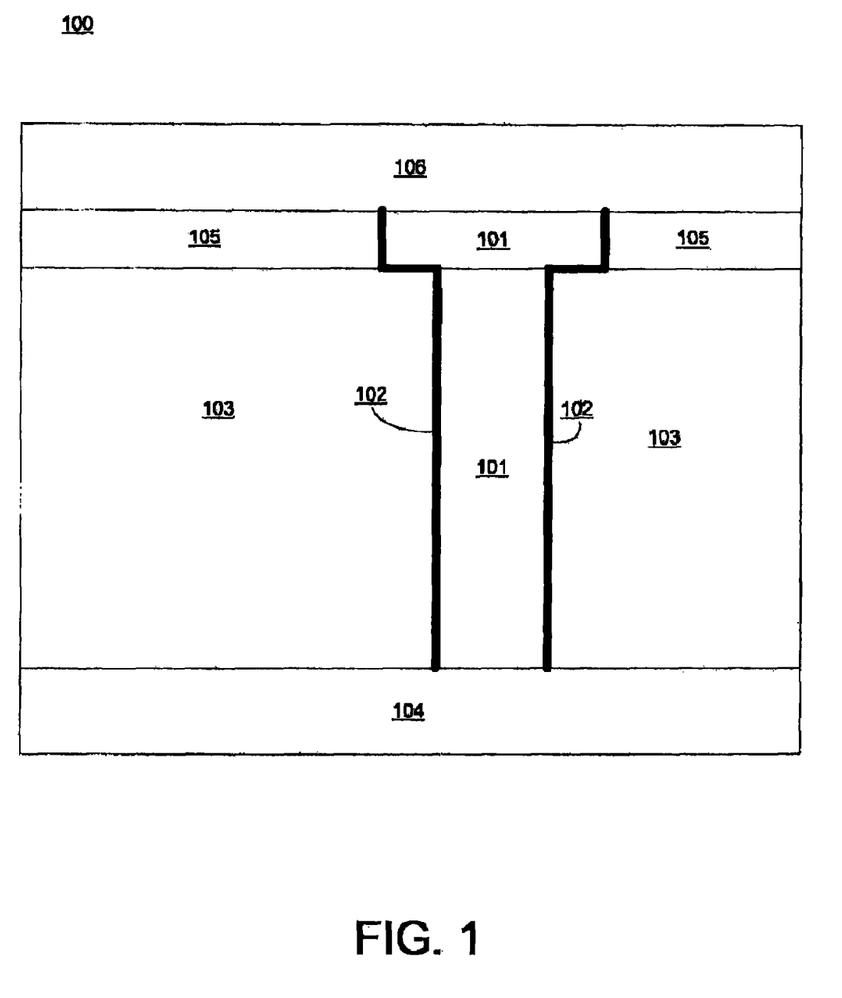
FIG. 1 illustrates a cross section of an embodiment of a semiconductor chip comprising a TSV.

FIG. 1 illustrates a cross section of an embodiment of a semiconductor chip 100 comprising a TSV. Semiconductor chip 100 comprises silicon substrate 103, oxide layer 105, and back-end-of-line (BEOL) stack 106. The TSV is filled with liner 102 and metal filling 101. The TSV is fabricated by deep etching into silicon substrate 103, in some embodiments to about 150 micrometers (μm) in depth. The depth of the TSV is a function of the etching time. Metal filling 101 may comprise any appropriate conductive metal, including but not limited to tungsten (W), copper (Cu), or aluminum (Al) in some embodiments. BSM 104 is disposed on the backside of silicon 103 after grinding of silicon 103 is performed.

Figure 2:
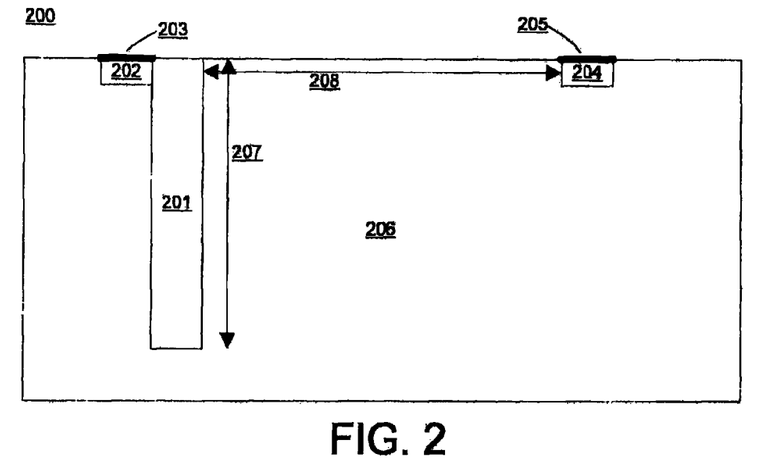
FIG. 2 illustrates a cross section of an embodiment of a test structure channel.

FIG. 2 illustrates an embodiment of a test structure channel 200. TSV 201 is filled with a liner and a metal filling. Heavily doped silicon resistive subcontact 202 and silicide pad 203 comprise a first electrical contact; the first electrical contact is electrically connected to TSV 201. Heavily doped silicon resistive subcontact 204 and silicide pad 205 comprise a second electrical contact. TSV 201 has a depth indicated by line 207, and the distance between TSV 201 and the second electrical contact is indicated by line 208. A current flowing through silicon substrate 206 between the first and second electrical contacts in the channel must flow through TSV 201. The resistance of the channel is proportional to the distance traveled by the current through silicon substrate 206, and may be used to determine the depth 207 of TSV 201. TSV 201 may comprise a test TSV that is etched for use in the test structure in some embodiments; in other embodiments, TSV 201 may comprise a functional TSV that is part of the semiconductor chip circuitry. Test TSVs are formed simultaneously with functional TSVs. Because TSV depth is a function of etching time, test TSVs have the same depth as functional TSVs.

Figure 3:
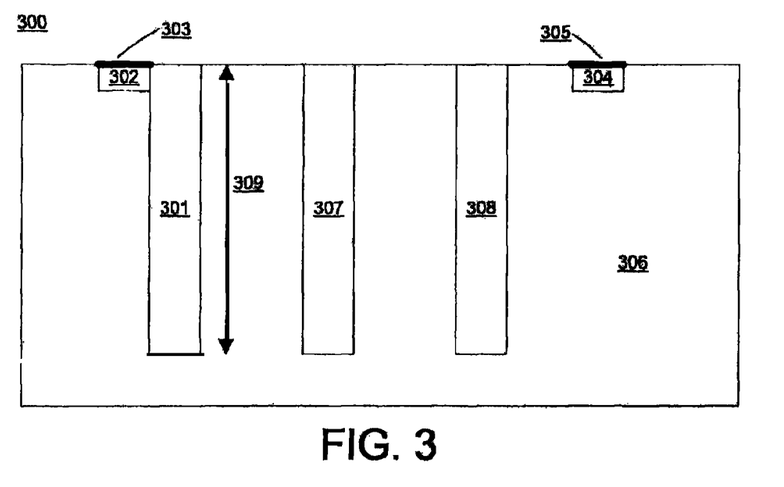
FIG. 3 illustrates a cross section of an embodiment of a test structure channel comprising isolation trenches.

FIG. 3 illustrates an embodiment of a generalized test structure channel 300 comprising isolation trenches 307 and 308. TSV 301 is filled with a liner and a metal filling, and has a depth indicated by line 309. Heavily doped silicon resistive subcontact 302 and silicide pad 303 comprise a first electrical contact; the first electrical contact is electrically connected to TSV 301. Heavily doped silicon resistive subcontact 304 and silicide pad 305 comprise a second electrical contact. A plurality of isolation trenches 307 and 308 are located between TSV 301 and the second electrical contact. Isolation trenches 307 and 308 are formed at the same time as TSV 301 and are not filled with liner and metal. Isolation trenches 307 and 308 may be empty or filled with electrically insulating material such as silicon oxide. Because depth is a function of etching time, isolation trenches 307 and 308 have the same depth 309 as TSV 301. Isolation trenches 307 and 308 are shown for illustrative purposes only, a test structure channel 300 may comprise any appropriate number of isolation trenches. A current flowing through silicon substrate 306 between the first and second electrical contacts in the channel must travel through TSV 301 and underneath isolation trenches 307 and 308. The resistance of the channel is proportional to the distance traveled by the current through silicon substrate 306, and may be used to determine the depth 309 of TSV 301. Isolation trenches 307 and 308 may improve the measurement sensitivity of TSV depth 309. TSV 301 may comprise a test TSV that is etched for use in the test structure in some embodiments; in other embodiments, TSV 301 may comprise a functional TSV that is part of the semiconductor chip circuitry. Test TSVs are formed simultaneously with functional TSVs. Because TSV depth is a function of etching time, test TSVs have the same depth as functional TSVs.

A test structure channel without isolation trenches, such as is shown in FIG. 2, may provide a measurement sensitivity of about 1 $\Omega/\mu m$, while a test structure with isolation trenches, such as is shown in FIG. 3, may have a sensitivity of about 1.5 $\Omega/\mu m$ or more. The TSV filling material may comprise copper or tungsten in some embodiments; the choice of filling material has minimal effect on measurement sensitivity. The isolation trenches may be filled with air or silicon oxide in some embodiments. The trench filling material may have an effect on simulated AC reactance, due to the presence of a capacitance effect that is proportional to the dielectric constant of the isolation trench filling material.

Figure 4:
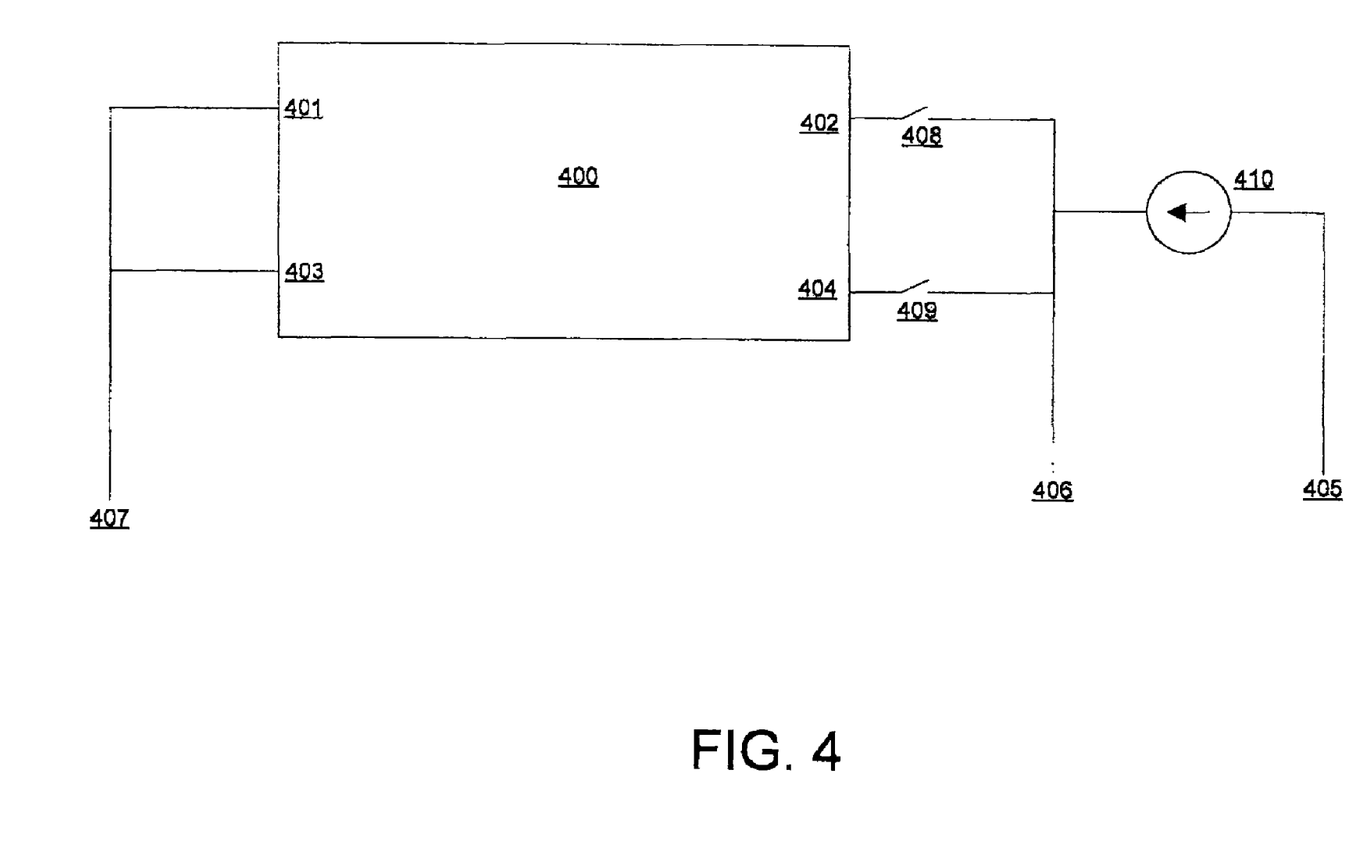
FIG. 4 illustrates an embodiment of a test structure.

FIG. 4 illustrates an embodiment of a test structure 400. Test structure 400 comprises two channels for reference purposes, in order to account for parasitic resistance from contacts or wiring. Points 401 and 402 comprise a first channel, and points 403 and 404 comprise a second channel. The first and second channels are connected to current source 410 via switches 408 and 409, respectively, and to terminals 405, 406 and 407. Terminal 407 is at 0V, and terminal 405 is at voltage ranging between 0.1V and 10V. In the first measurement, switch 408 is closed and switch 409 is opened, such that a current $I_o$ from current source 410 flows from point 402 to point 401, and a voltage $V_1$ is determined at terminal 406. Then switch 409 closed and switch 408 is opened so that $I_o$ flows from point 404 to point 403, and a voltage $V_2$ is then determined at terminal 406. Because current $I_o$ is known, the voltage difference ($V_1-V_2$) indicates the resistance difference between the first channel, which has resistance $R_1$, and the second channel, which has resistance $R_2$. I.e., $(R_1-R_2)=$ $(V_1-V_2)/I_o$. Since $(R_1-R_2)$ is a function of the TSV depth, the value of $(V_1-V_2)$ may be used to determine TSV depth.

Figure 5A:
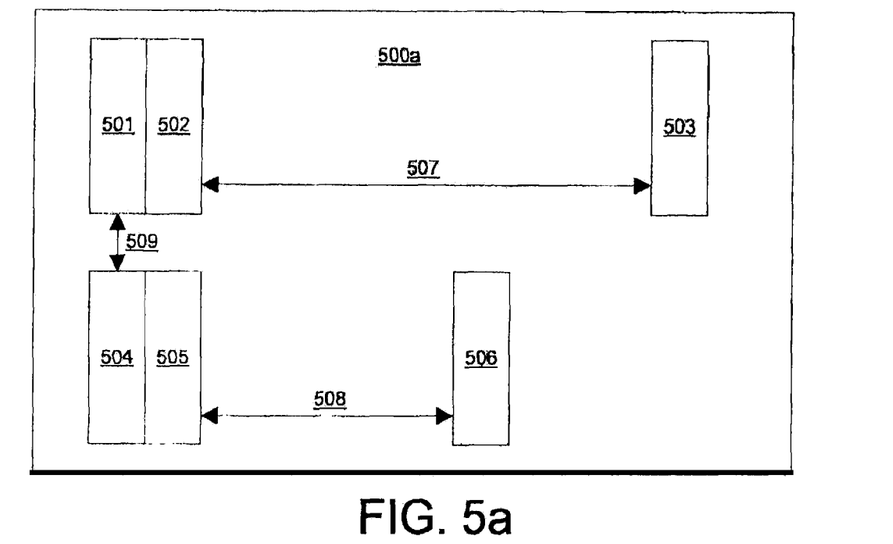
FIG. 5a illustrates a top view of an embodiment of a test structure.
Figure 5B:
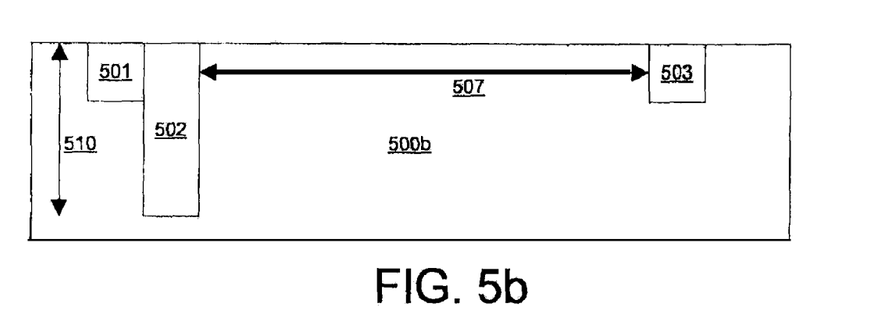
FIG. 5b illustrates a cross section of an embodiment of a test structure.
Figure 5C:
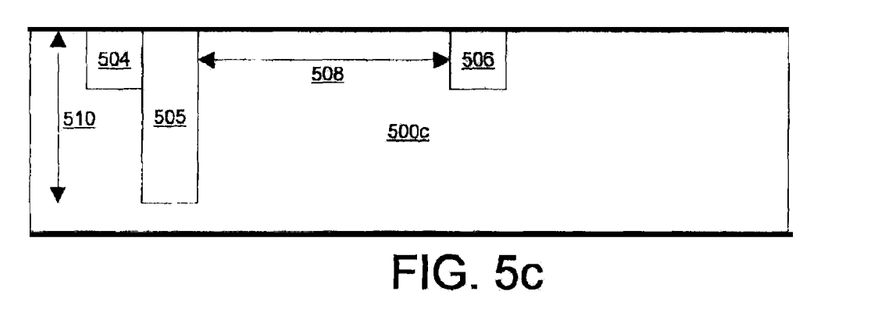
FIG. 5c illustrates a cross section of an embodiment of a test structure.

An embodiment of test structure 400 of FIG. 4 in a semiconductor chip is shown in FIGS. 5a, 5b, and 5c. FIG. 5a illustrates a top view 500a of test structure 400. TSVs 502 and 505 are filled with a liner and a metal filling. Electrical contact 501 is connected to TSV 502; together 501 and 502 are equivalent to point 401 of FIG. 4. Electrical contact 503 is equivalent to point 402 of FIG. 4. TSV 502 and electrical contact 503 are separated by distance 507. Electrical contact 501, TSV 502, and electrical contact 503 form the first channel. Electrical contact 504 is connected to TSV 505; together electrical contact 504 and TSV 505 are equivalent to point 403 of FIG. 4. Electrical contact 506 is equivalent to point 404 of FIG. 4. TSV 505 and electrical contact 506 are separated by distance 508. Distance 508 may be half of distance 507 in some embodiments. Electrical contact 504, TSV 505, and electrical contact 506 form the second channel. The first channel and the second channel are separated by distance 509. No isolation trench is required between the first and second channels due to the sequential measurements.

FIG. 5b shows a cross section 500b of FIG. 5a along the first channel. Electrical contact 501 is electrically connected to TSV 502, which is separated from electrical contact 503 by distance 507. TSV 502 has a depth 510. FIG. 5c shows a cross section 500c of FIG. 5a along the second channel. Electrical contact 504 is electrically connected to TSV 505, which is separated from electrical contact 506 by distance 508. TSV 505 is of depth 510. A current flowing in the first channel between contact 501 and contact 503 must travel through TSV 502, and a current flowing in the second channel between contact 504 and contact 506 must travel through TSV 505. The resistance of the first and second channels is proportional to the distance traveled by the current through the silicon substrate; the difference in resistance between the two channels may be used to determine the depth 510 of TSVs 502 and 505.

Figure 6A:
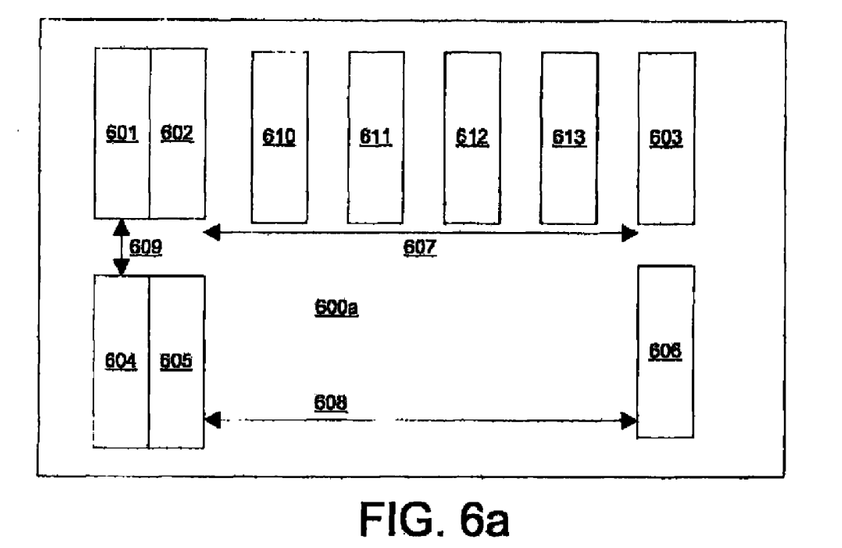
FIG. 6a illustrates a top view of an embodiment of a test structure.
Figure 6B:
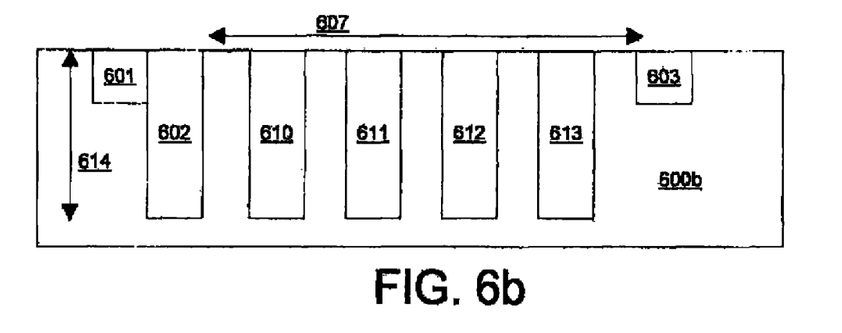
FIG. 6b illustrates a cross section of an embodiment of a test structure.
Figure 6C:
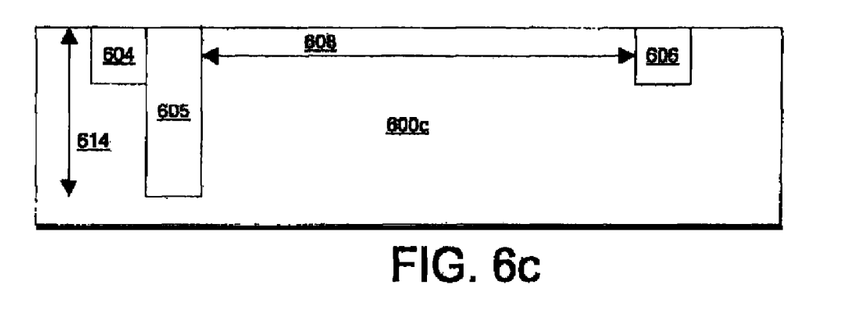
FIG. 6c illustrates a cross section of an embodiment of a test structure.

An embodiment of test structure 400 of FIG. 4 in a semiconductor chip is shown in FIGS. 6a, 6b, and 6c. FIG. 6a illustrates a top view 600a of test structure 400. TSVs 602 and 605 are filled with a liner and a metal filling. Electrical contact 601 is connected to TSV 602; together electrical contact 601 and TSV 602 are equivalent to point 401 of FIG. 4. Electrical contact 603 is equivalent to point 402 of FIG. 4. TSV 602 and electrical contact 603 are separated by distance 607. Isolation trenches 610-613 are located in between TSV 602 and electrical contact 603. Isolation trenches 610-613 are shown for illustrative purposes only; any appropriate number of isolation trenches may form the first channel. Electrical contact 601, TSV 602, isolation trenches 610-613, and electrical contact 603 form the first channel. Electrical contact 604 is connected to TSV 605; together 604 and 605 are equivalent to point 403 of FIG. 4. Electrical contact 606 is equivalent to point 404 of FIG. 4. TSV 605 and electrical contact 606 are separated by distance 608. Distance 608 may be equal to distance 607 in some embodiments. Electrical contact 604, TSV 605, and electrical contact 606 form the second channel. The first channel and the second channel are separated by distance 609.

FIG. 6b shows a cross section 600b of FIG. 6a along the first channel. Electrical contact 601 is electrically connected to TSV 602, which is separated from electrical contact 603 by distance 607. Isolation trenches 610-613 are located in between TSV 602 and electrical contact 603. TSV 602 and isolation trenches 610-613 have a depth 614. FIG. 6c shows a cross section 600c of FIG. 6a along the second channel. Electrical contact 604 is electrically connected to TSV 605, which is separated from electrical contact 606 by distance 608. TSV 605 is of depth 614. A current flowing in the first channel between contact 601 and contact 603 must travel through TSV 602 and isolation trenches 610-613, and a current flowing in the second channel between contact 604 and contact 606 must travel through TSV 605. The resistance of the first and second channels is proportional to the distance traveled by the current through the silicon substrate; the difference in resistance between the two channels may be used to determine the depth 614 of TSVs 602 and 605.

Figure 7:
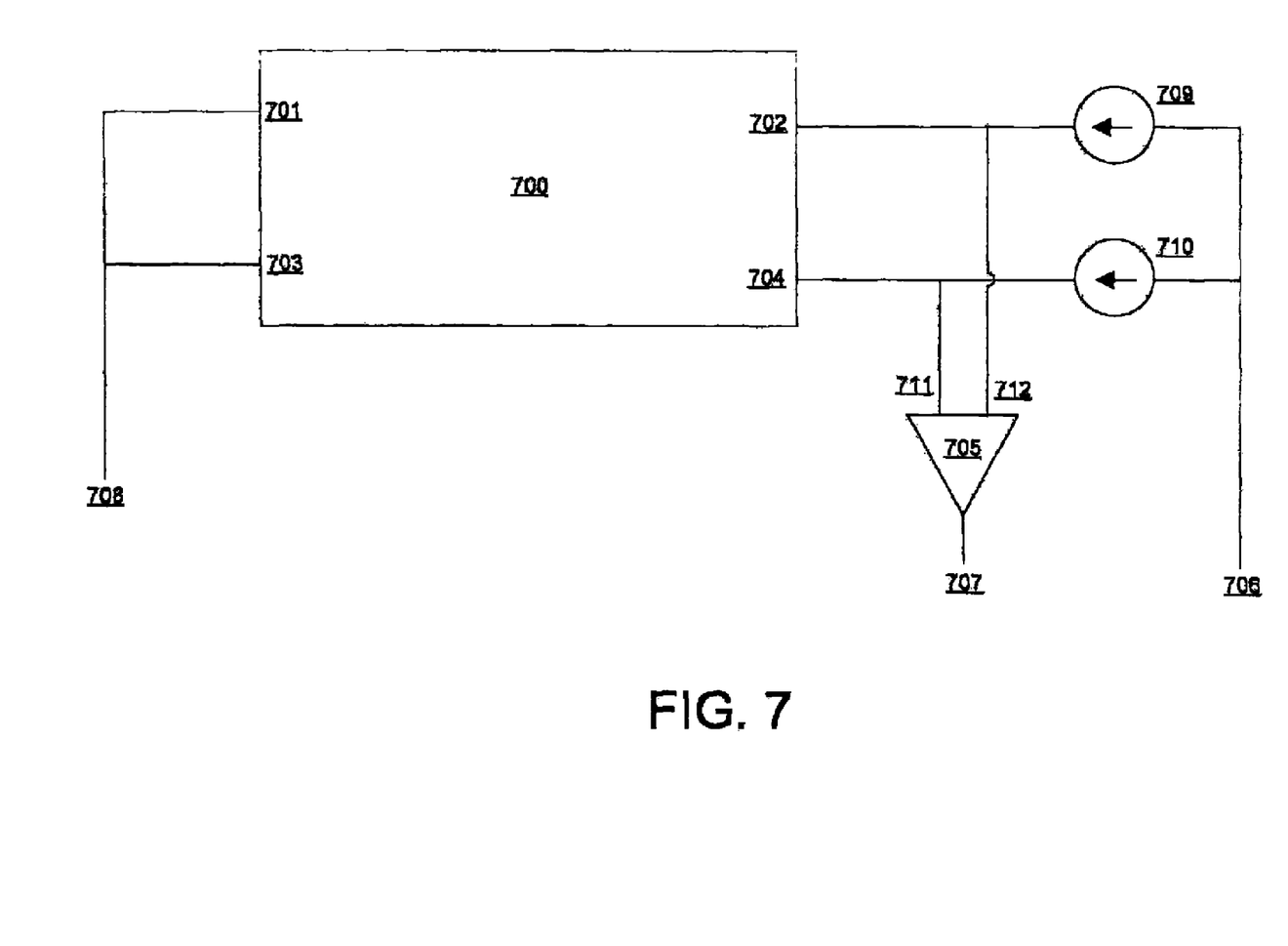
FIG. 7 illustrates an embodiment of a test structure.

FIG. 7 illustrates an embodiment of a test structure 700. Test structure 700 comprises two channels for reference purposes, in order to account for parasitic resistance from contacts or wiring. Points 701 and 702 comprise the first channel, and points 703 and 704 comprise the second channel. The first and second channels are connected to identical current sources 709 and 710, respectively, and to terminals 706, 707, and 708. Current sources 709 and 710 each produce current $I_o$. Terminal 708 is at 0V, and terminal 706 is at a voltage ranging between 0.1V and 10V. The voltage across the first channel is $V_1$, and the voltage across the second channel is $V_2$. Amplifier 705 comprises differential inputs. The non-inverting input 712 of amplifier 705 is connected to $V_1$, and the inverting input 711 of amplifier 705 is connected to $V_2$. The resulting output voltage of amplifier 705 at terminal 707 is equivalent to the voltage difference $(V_1-V_2)$ between the first channel and the second channel. Because current $I_o$ is known, the voltage difference $(V_1-V_2)$ may be used to determine the resistance difference between the first channel, which has resistance $R_1$, and the second channel, which has resistance $R_2$. I.e., $(R_1-R_2)=(V_1-V_2)/I_o$. Since $(R_1-R_2)$ is a function of the TSV depth, the value of $(V_1-V_2)$ at terminal 707 may be used to determine TSV depth.

Figure 8A:
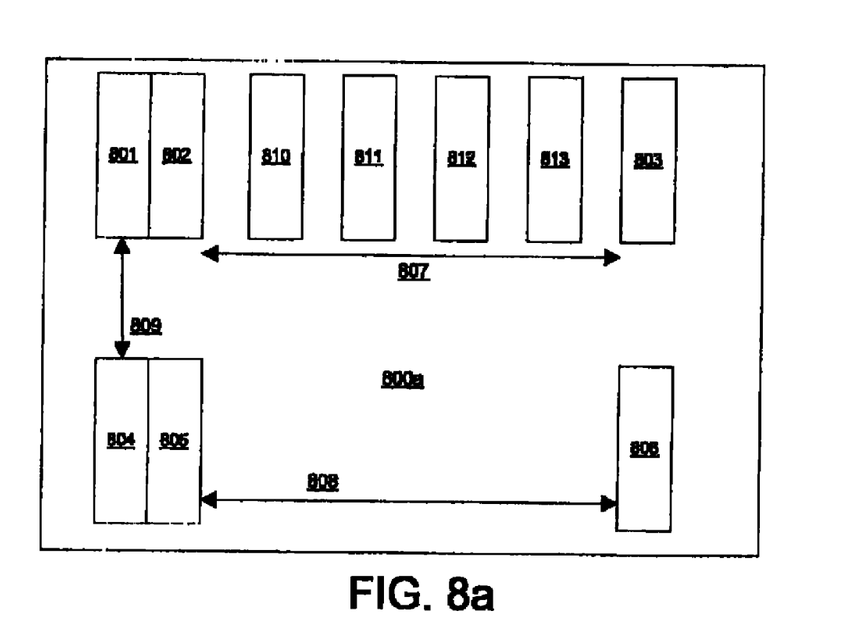
FIG. 8a illustrates a top view of an embodiment of a test structure.
Figure 8B:
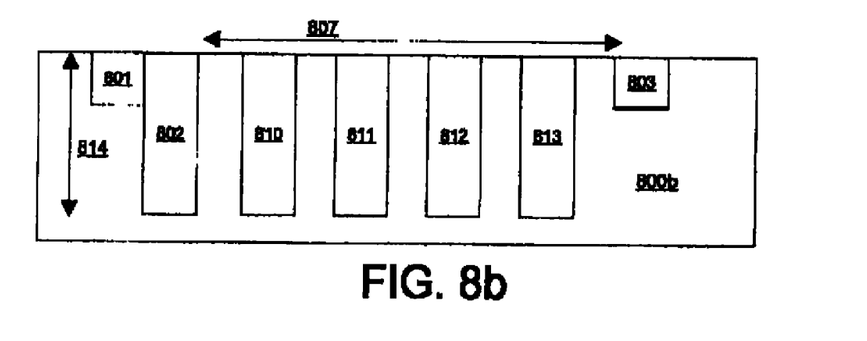
FIG. 8b illustrates a cross section of an embodiment of a test structure.
Figure 8C:
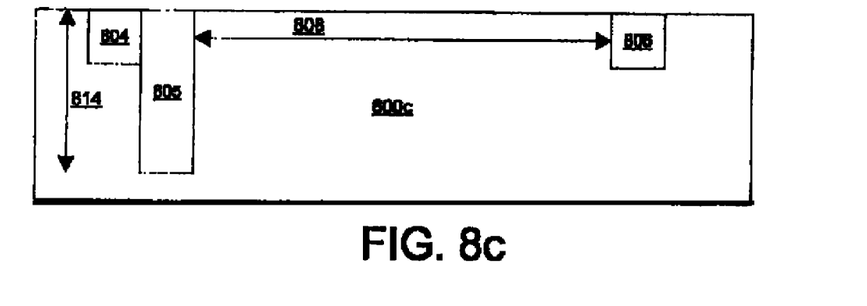
FIG. 8c illustrates a cross section of an embodiment of a test structure.

An embodiment of test structure 700 of FIG. 7 in a semiconductor chip is shown in FIGS. 8a, 8b, and 8c. FIG. 8a illustrates a top view 800a of test structure 700. TSVs 802 and 805 are filled with a liner and a metal filling. Electrical contact 801 is connected to TSV 802; together 801 and 802 are equivalent to point 701 of FIG. 7. Electrical contact 803 is equivalent to point 702 of FIG. 7. TSV 802 and electrical contact 803 are separated by distance 807. Isolation trenches 810-813 are located in between TSV 802 and electrical contact 803. Isolation trenches 810-813 are shown for illustrative purposes only; any appropriate number of isolation trenches may form the first channel. Electrical contact 801, TSV 802, isolation trenches 810-813, and electrical contact 803 form the first channel. Electrical contact 804 is connected to TSV 805; together electrical contact 804 and TSV 805 are equivalent to point 703 of FIG. 7. Electrical contact 806 is equivalent to point 704 of FIG. 7. TSV 805 and electrical contact 806 are separated by distance 808. Distance 808 may be equal to distance 807 in some embodiments. Electrical contact 804, TSV 805, and electrical contact 806 form the second channel. The first channel and the second channel are separated by distance 809, which may be at least 10 times distance 807 or distance 808 in some embodiments.

FIG. 8b shows a cross section 800b of FIG. 8a along the first channel. Electrical contact 801 is electrically connected to TSV 802, which is separated from electrical contact 803 by distance 807. Isolation trenches 810-813 are located in between TSV 802 and electrical contact 803. TSV 802 and isolation trenches 810-813 have a depth 814. FIG. 8c shows a cross section 800c of FIG. 8a along the second channel. Electrical contact 804 is electrically connected to TSV 805, which is separated from electrical contact 806 by distance 808. TSV 805 is of depth 814. A current flowing in the first channel between contact 801 and contact 803 must travel through TSV 802 and isolation trenches 810-813, and a current flowing in the second channel between contact 804 and contact 806 must travel through TSV 805. The resistance of the first and second channels is proportional to the distance traveled by the current through the silicon substrate; the difference in resistance between the two channels may be used to determine the depth 814 of TSVs 802 and 805.

Figure 9A:
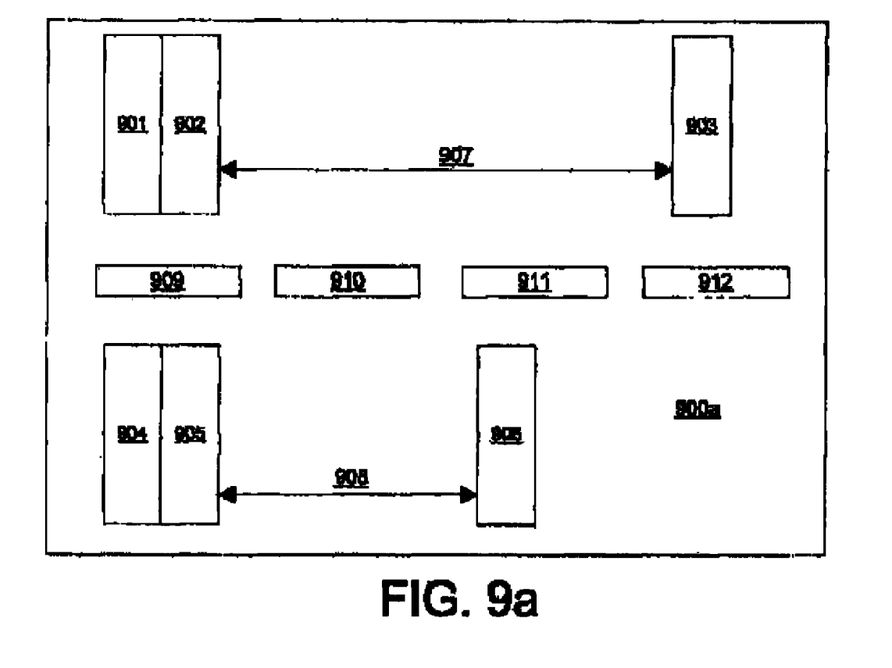
FIG. 9a illustrates a top view of an embodiment of a test structure.
Figure 9B:
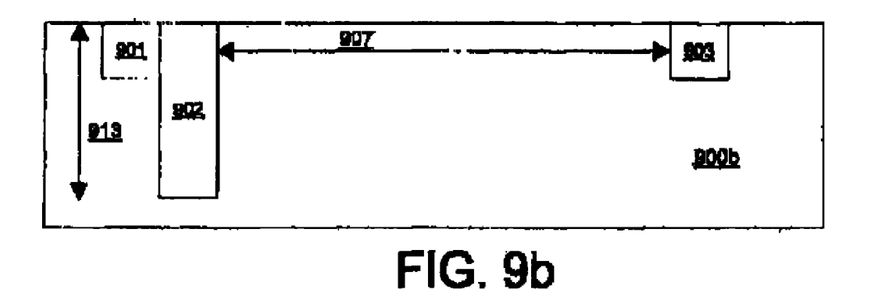
FIG. 9b illustrates a cross section of an embodiment of a test structure.
Figure 9C:
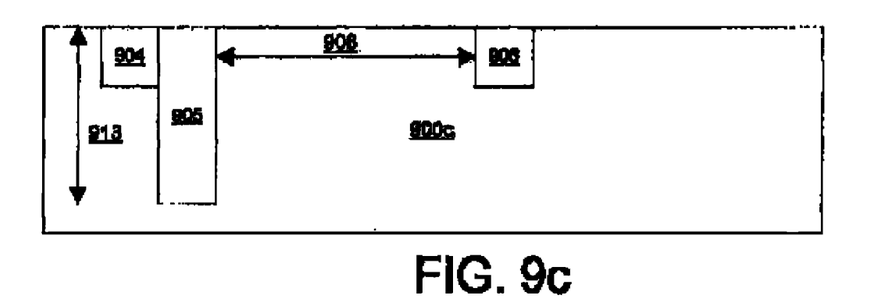
FIG. 9c illustrates a cross section of an embodiment of a test structure.

An embodiment of test structure 700 of FIG. 7 in a semiconductor chip is shown in FIGS. 9a, 9b, and 9c. FIG. 9a illustrates a top view 900a of test structure 700. TSVs 902 and 905 are filled with a liner and a metal filling. Electrical contact 901 is connected to TSV 902; together 901 and 902 are equivalent to point 701 of FIG. 7. Electrical contact 903 is equivalent to point 702 of FIG. 7. TSV 902 and electrical contact 903 are separated by distance 907. Electrical contact 901, TSV 902, and electrical contact 903 form the first channel. Electrical contact 904 is connected to TSV 905; together electrical contact 904 and TSV 905 are equivalent to point 703 of FIG. 7. Electrical contact 906 is equivalent to point 704 of FIG. 7. TSV 905 and electrical contact 906 are separated by distance 908. Distance 908 may be half of distance 907 in some embodiments. Electrical contact 904, TSV 905, and electrical contact 906 form the second channel. The first channel and the second channel are separated by isolation trenches 909-912 in some embodiments. Isolation trenches 909-912 prevent interference between the first channel and second channel. Isolation trenches 909-912 are shown for illustrative purposes only; the test structure may comprise any appropriate number of isolation trenches. In embodiments that do not comprise isolation trenches 909-912, the first and second channels may be separated by a distance of at least 10 times distance 907 in order to reduce interference between the first and second channels.

FIG. 9b shows a cross section 900b of FIG. 9a along the first channel. Electrical contact 901 is electrically connected to TSV 902, which is separated from electrical contact 903 by distance 907. TSV 902 has a depth 913. FIG. 9c shows a cross section 900c of FIG. 9a along the second channel. Electrical contact 904 is electrically connected to TSV 905, which is separated from electrical contact 906 by distance 908. TSV 905 is of depth 913. A current flowing in the first channel between contact 901 and contact 903 must travel through TSV 902, and a current flowing in the second channel between contact 904 and contact 906 must travel through TSV 905. The resistance of the first and second channels is proportional to the distance traveled by the current through the silicon substrate; the difference in resistance between the two channels may be used to determine the depth 913 of TSVs 902 and 905.

Figure 10A:
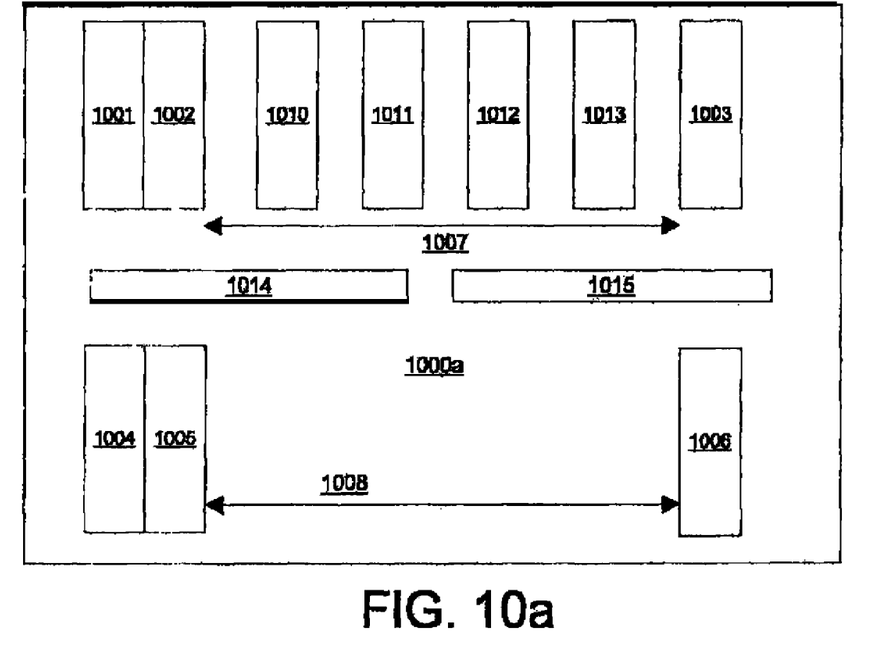
FIG. 10a illustrates a top view of an embodiment of a test structure.
Figure 10B:
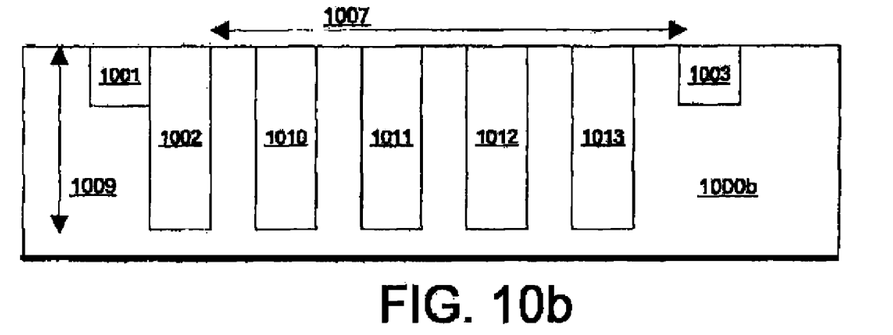
FIG. 10b illustrates a cross section of an embodiment of a test structure.
Figure 10C:
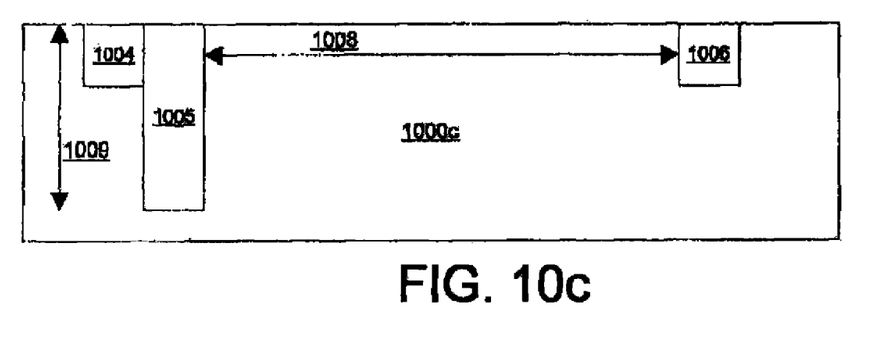
FIG. 10c illustrates a cross section of an embodiment of a test structure.

An embodiment of test structure 700 of FIG. 7 in a semiconductor chip is shown in FIGS. 10a, 10b, and 10c. FIG. 10a illustrates a top view 1000a of test structure 700. TSVs 1002 and 1005 are filled with a liner and a metal filling. Electrical contact 1001 is connected to TSV 1002; together electrical contact 1001 and TSV 1002 are equivalent to point 701 of FIG. 7. Electrical contact 1003 is equivalent to point 702 of FIG. 7. TSV 1002 and electrical contact 1003 are separated by distance 1007. Isolation trenches 1010-1013 are located in between TSV 1002 and electrical contact 1003. Isolation trenches 1010-1013 are shown for illustrative purposes only; any appropriate number of isolation trenches may form the first channel. Electrical contact 1001, TSV 1002, isolation trenches 1010-1013, and electrical contact 1003 form the first channel. Electrical contact 1004 is connected to TSV 1005; together electric contact 1004 and TSV 1005 are equivalent to point 703 of FIG. 7. Electrical contact 1006 is equivalent to point 704 of FIG. 7. TSV 1005 and electrical contact 1006 are separated by distance 1008. Distance 1008 may be equal to distance 1007 in some embodiments. Electrical contact 1004, TSV 1005, and electrical contact 1006 form the second channel. The first channel and the second channel are separated by isolation trenches 1014-1015. Isolation trenches 1014-1015 prevent interference between the first channel and second channel. Isolation trenches 1014-1015 are shown for illustrative purposes only; the test structure may comprise any appropriate number of isolation trenches.

FIG. 10b shows a cross section 1000b of FIG. 10a along the first channel. Electrical contact 1001 is electrically connected to TSV 1002, which is separated from electrical contact 1003 by distance 1007. Isolation trenches 1010-1013 are located in between TSV 1002 and electrical contact 1003. TSV 1002 and isolation trenches 1010-1013 have a depth 1009. FIG. 10c shows a cross section 1000c of FIG. 10a along the second channel. Electrical contact 1004 is electrically connected to TSV 1005, which is separated from electrical contact 1006 by distance 1008. TSV 1005 is of depth 1009. A current flowing in the first channel between contact 1001 and contact 1003 must travel through TSV 102 and underneath isolation trenches 1010-1013, and a current flowing in the second channel between contact 1004 and contact 1006 must travel through TSV 1005. The resistance of the first and second channels is proportional to the distance traveled by the current through the silicon substrate; the difference in resistance between the two channels may be used to determine the depth 1009 of TSVs 1002 and 1005.

Figure 11:
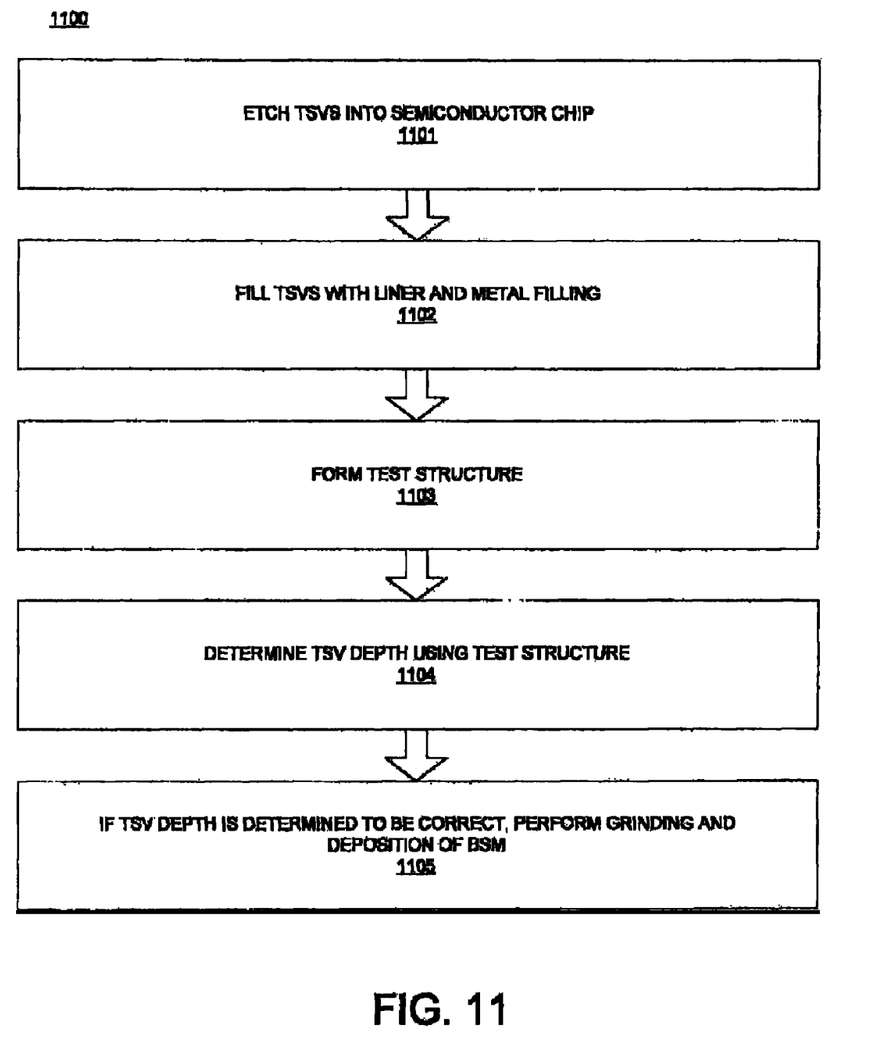
FIG. 11 illustrates a method of determining TSV depth.

FIG. 11 illustrates an embodiment of a method of testing TSV depth in a semiconductor chip. In block 1101, one or more TSVs are etched in the semiconductor chip. In some embodiments, isolation trenches also etched into the semiconductor chip simultaneously with the TSVs. In block 1102, the TSVs are filled with a liner and metal filling. In block 1103, a test structure is formed around the TSVs. The test structure comprises electrical contacts; each electrical contact comprises a heavily doped silicon resistive subcontact and a silicide pad. The test structure may correspond to one of the embodiments discussed above with regards to FIGS. 4-10c. In block 1104, the TSV depth is determined using the test structure. In block 1105, if the TSV depth is determined to be correct (i.e., meets a predetermined threshold), grinding and application of BSM are performed on the backside of the semiconductor chip.

Figure 12:
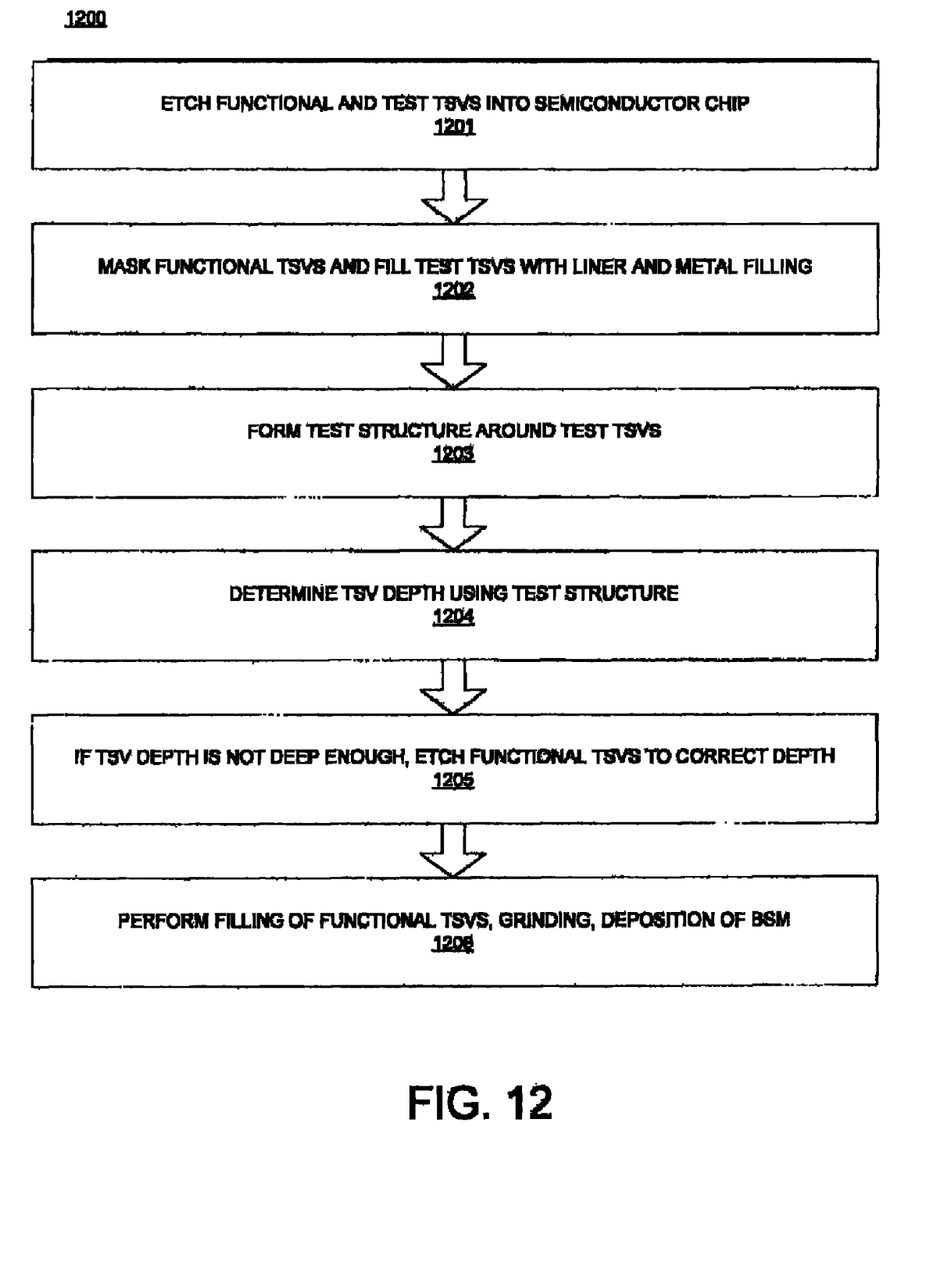
FIG. 12 illustrates a method of determining TSV depth.

FIG. 12 illustrates an embodiment of a method of testing TSV depth in a semiconductor chip. In block 1201, TSVs are etched in the semiconductor chip. Test TSVs and functional TSVs are etched simultaneously; because TSV depth is a function of etching time, the test TSVs and the functional TSVs have the same depth. In some embodiments, isolation trenches also etched into the semiconductor chip simultaneously with the test and functional TSVs. The test TSVs and the isolation trenches may be formed in the kerf region of the semiconductor chip. In block 1202, the functional TSVs are masked, and the test TSVs are filled with a liner and a metal filling. In embodiments comprising isolation trenches, the isolation trenches are also masked. In block 1203, a test structure is formed around the test TSVs. The test structure comprises electrical contacts; each electrical contact comprises a heavily doped silicon resistive subcontact and a silicide pad. The test structure may correspond to one of the embodiments discussed above with regards to FIGS. 4-10c. In block 1204, the depth of the test TSVs is determined using the test structure. In block 1205, in the event the test TSVs are determined not to be deep enough (i.e., do not meet a predetermined threshold), the functional TSVs are further etched to the correct depth. In block 1206, filling of the functional TSVs with a liner and metal filling, and grinding and application of BSM on the backside of the semiconductor chip, are performed.

The technical effects and benefits of exemplary embodiments include improved yield of semiconductor chips, due to detection of defective TSVs relatively early in the fabrication process.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of determining a depth of a through-silicon-via (TSV) in a semiconductor chip, the method comprising:
   etching a first TSV into the semiconductor chip;
   etching one or more isolation trenches in the semiconductor chip simultaneously with the first TSV;
   filling the first TSV with a liner and a metal filling, and masking the one or more isolation trenches during filling of the first TSV with the liner and metal filling;
   forming a first channel, the first channel comprising the first TSV, a first contact electrically connected to the first TSV, and a second contact, wherein the one or more isolation trenches are located between the first TSV and the second contact;
   connecting a current source to the second contact;
   determining a resistance of the first channel; and
   determining a depth of the first TSV based on the resistance of the first channel.

2. The method of claim 1, further comprising:
   etching a second TSV into the semiconductor chip simultaneously with the first TSV; and
   masking the second TSV during filling of the first TSV with the liner and the metal filling.

3. The method of claim 2, wherein the metal filling comprises one of copper, tungsten, and aluminum.

4. The method of claim 2, further comprising in the event the depth of the first TSV is lower than a predetermined threshold, reworking the second TSV; and
   filling the second TSV with a respective liner and metal filling after reworking the second TSV.

5. The method of claim 1, further comprising wherein the one or more isolation trenches are filled with an insulating material.

6. The method of claim 5, wherein the insulating material in the one or more isolation trenches comprises silicon oxide.

7. The method of claim 1, further comprising etching a second TSV into the semiconductor chip, and forming a second channel comprising the second TSV, a third contact electrically connected to the second TSV, and a fourth contact, the second TSV, third contact, and fourth contact being distinct from the first TSV, first contact, and second contact.

8. The method of claim 7, wherein the second TSV is etched simultaneously with the first TSV, and has a depth that is the same as a depth of the first TSV.

9. The method of claim 7, further comprising etching a plurality of isolation trenches between the first channel and the second channel.

10. The method of claim 7, further comprising:
connecting a first switch between the current source and the first channel;
connecting a second switch between the current source and the second channel,
closing the first switch and opening the second switch to determine the resistance of the first channel;
opening the first switch and closing the second switch to determine a resistance of the second channel, and
determining the depth of the first TSV from the resistance of the first channel and the resistance of the second channel.

11. The method of claim 7, further comprising:
connecting a second current source to the fourth contact;
connecting a differential amplifier between the first channel and the second channel;
determining a voltage difference between the first channel and the second channel by the differential amplifier,
determining the resistance of the first channel and a resistance of the second channel based on the voltage difference between the first channel and the second channel; and
determining the depth of the first TSV from the resistance of the first channel and the resistance of the second channel.

* * * * *